United States Patent
Chang et al.

(10) Patent No.: US 6,713,230 B2
(45) Date of Patent: Mar. 30, 2004

(54) PHOTOSENSITIVE INK COMPOSITION

(75) Inventors: Chi-Ming Chang, Taiwan (TW); Hsiao-Loung Lu, Taiwan (TW); Chun-Che Tsao, Taiwan (TW); Cheng-Li Chao, Taiwan (TW); Chung-Chi Su, Taiwan (TW)

(73) Assignee: Nan Ya Plastics Corporation, Taipei (TW)

( * ) Notice: Subject to any disclaimer, the term of this patent is extended or adjusted under 35 U.S.C. 154(b) by 1 day.

(21) Appl. No.: 09/948,580

(22) Filed: Sep. 10, 2001

(65) Prior Publication Data

US 2002/0136986 A1 Sep. 26, 2002

Related U.S. Application Data

(63) Continuation-in-part of application No. 09/425,934, filed on Oct. 25, 1999, now abandoned.

(51) Int. Cl.$^7$ .............................................. G03F 7/027
(52) U.S. Cl. ..................................... 430/280.1; 522/71
(58) Field of Search ........................ 430/280.1; 522/71

(56) References Cited

U.S. PATENT DOCUMENTS

| | | | | |
|---|---|---|---|---|
| 4,943,516 A | * | 7/1990 | Kamayachi et al. ..... | 430/280.1 |
| 5,554,670 A | * | 9/1996 | Giannelis et al. ........... | 523/209 |
| 5,665,526 A | * | 9/1997 | Markovich et al. ......... | 430/325 |
| 5,830,528 A | * | 11/1998 | Beall et al. ................. | 427/220 |
| 5,858,618 A | * | 1/1999 | Tzou ........................ | 430/285.1 |

OTHER PUBLICATIONS

"Epoxy Resins" John Gannon, Consultant, Kirk–Othmer Encyclopedia of Chemical Technology, Copyright 1994 by John Wiley and Sons, Inc, Article posted on line Dec. 4, 2000, Abstract, 2. Resin Properties, 10 pages from www.mrw.interscience.wiley.*

* cited by examiner

*Primary Examiner*—Cynthia Hamilton
(74) *Attorney, Agent, or Firm*—Bacon & Thomas, PLLC

(57) ABSTRACT

Provided is a novel photosensitive resistive ink composition, comprising: (A) a photo curable prepolymer containing at least two ethylenically unsaturated bonds with an $a,\beta$-unsaturated carboxylic acid, represented by the formula I, (B) a photocurable monomer containing at least three vinyl groups and an $a,\beta$-unsaturated carboxylic acid, (C) a photo-initiator, (D) organic solvents, (E) an epoxy compound containing at least one vinyl group and one epoxy group in the molecule unit, (F) a curing agent capable of allowing a photocurable prepolymer (A) undergo a thermal reaction, and (G) a clay nano-composite capable of increasing the surface area of inorganic materials of the photosensitive resistive ink composition. The composition produces a solder mask film having a desired pattern after coating, exposure, development and postcuring and excellent in adhesiveness, resistance to chemicals, resistance to insulatiion, resistance to heat, developability, pot life, resistance to electroless gold plating, transparency of the photoresist film and resolution.

11 Claims, No Drawings

PHOTOSENSITIVE INK COMPOSITION

This application is a Continuation-in-part of nonprovisional application Ser. No. 09/425,934 filed Oct. 25, 1999 now abandoned.

FIELD OF THE INVENTION

This invention relates to a novel photosensitive resistive ink composition, which can be used for forming a permanent protective mask, such as solder resist or the like, to be employed for the production of printed circuit boards (printed wiring boards), has high sensitivity and high resolution (line width 50 $\mu$m) and high speed curability to a ultraviolet irradiation, and is developable with a dilute alkaline aqueous solution and forms by curing a dry film excellent in electroless gold plating resistance, soldering heat resistance, electrical characteristics and mechanical characteristics. In addition, it's easy to inspect the appearance by a formed photoresist film having a bright and transparent property.

BACKGROUND OF INVENTION

Due to the recent trend toward smaller size and higher functionality of electronic equipment and apparatus and toward higher connection density, higher pin and refinement of electronic packing technology, solder mask has been required to be of higher resolution, accuracy and reliability to match the refined surface mount technology. Various improvements in the solder mask have been proposed. Solder mask has been improved from a screen printing method having low resolution and high pollution disadvantages to a liquid photo-imaginable solder mask method developable with a dilute alkaline aqueous solution and having high resolution and low pollution advantages. However, there are many drawbacks in the liquid photo-imaginable solder mask. For instance, U.S. Pat. No. 4,943,516 proposes a resin composition comprising an undissolved epoxy compound to improve photosensitivity and decrease to react with a curing agent. A photo-curable prepolymer has a higher acid value to dissolve in a dilute alkaline aqueous solution, but it causes the poor resistance to plating. Moreover, because of the network structure after photoreaction, the undissolved epoxy compound reduces the opportunity of reacting with a curing agent to cause the poor resistance to heat.

BRIEF SUMMARY OF THE INVENTION

The major object of this invention is to overcome the drawbacks mentioned above and to provide a novel photosensitive resist ink composition useful as a liquid photo-imaginable solder mask, which has superior ultraviolet curability, soldering eat and chemical resistance, electroless gold plating resistance, flexibility, electrical characteristics and is developable with a dilute alkaline aqueous solution and also has bright and transparent appearance.

This invention relates to a liquid photosensitive resistive ink composition developed with a dilute alkaline aqueous solution, which comprises:

(A) a photo-curable prepolymer represented by the formula I, obtained by the reaction of (a) epoxy resin containing at least two terminated epoxy groups and (b) a,β-unsaturated monocarboxylic acid containing at least one vinyl group, and then reacting (c) a saturated or unsaturated polybasic acid anhydride.

(B) a photo-curable monomer containing at least three vinyl groups and an a,β-unsaturated carboxylic acid represented by the formula II, (C) a photo-initiator, (D) organic solvents, (E) an epoxy compound containing at least one vinyl group and one epoxy group in the molecular unit represented by the formula III, (F) a curing agent capable of allowing a prepolymer (A) undergo a thermal reaction, and (G) a clay nano-composite.

DETAILED DESCRIPTION OF THE INVENTION

One characteristic of the invention is in the prepolymer (A) comprises at least one vinyl group in a molecular unit. The vinyl group increases the photocuring strength, resolution and resistance to plating of a liquid photo-imageable solder mask. In addition, the photo-curable monomer (B) of the invention comprising hydrophilic carboxylic acid group increase the solubility difference between the exposed area and unexposed area. And it can increase the developability and resolution. Moreover, the epoxy compound (E) containing at least one vinyl group and one epoxy group in the molecular unit offers steric hindrance which prevents the reaction (E) with a curing agent and a photo-curable prepolymer. The vinyl group of the compound (E) can be reacted with the photocurable prepolymer to increase the opportunity of the thermal reaction during curing and to enhance heat resistance. The compound (E) can be dissolved in organic solvents and a dilute alkaline aqueous solution to make the appearance bright and crystalline and to be easy to develop.

The liquid photo-curable pre-polymer (A) of the invention by the formula (I) as follow, which is a reaction product obtained by reacting (a) an epoxy resin containing at least two terminated epoxy groups and (b) an unsaturated monocarboxylic acid containing at least one vinyl group, and then reacting with a saturated or unsaturated carboxylic acid anhydride.

(formula I)

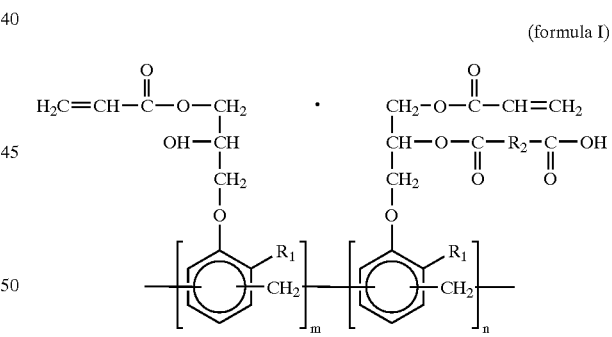

m,n: repeating units, represented by integers as m+n$\leq$20

$R_1$: —H, —CH$_3$ $R_2$:

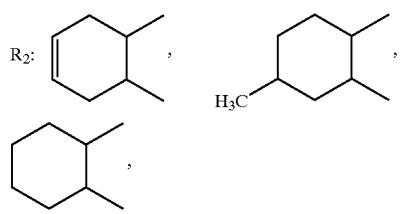

—CH$_2$—CH$_2$—, —CH=CH—

(a) of at least two epoxy compounds which can be used in this invention are represented as phenol novolac epoxy resins, cresol novolac epoxy resins, halogenated phenol novolac epoxy resins. Among these epoxy resins, phenol novolac epoxy resins and cresol novolac epoxy resins are preferred.

(b) α,β-unsaturated monocarboxylic acid containing at least one vinyl linkage can be included as: acrylic acid, methacrylic acid, crotonic acid and cinnamic acid. Among these unsaturated monocarboxylic acid mentioned above, acrylic acid is particularly preferable.

The saturated or unsaturated anhydride (c) can be selected from succinic anhydride, hexahydrophthalic anhydride, methylhexahydrophthalic anhydride, tetrahydrophthalic anhydride and maleic anhydride. Among these saturated or unsaturated anhydride mentioned above, tetrahydrophthalic anhydride is particularly preferable.

According to above mentioned discussion, the amount and ratio of each component could get the best result in the following region. In the reaction, the suitable proportion of an unsaturated monocarboxylic acid containing at least one vinyl group taking part in the reaction is 0.5 to 1.2 mole, preferably 0.9 to 1.1 mole, to 1 equivalent of the epoxy groups of the epoxy compound. The proportion of polybasic acid anhydride (c) is 0.1 to 1.0 mole, preferably 0.3 to 0.5 mole, to 1 equivalent of the hydroxyl group produced by reacting above-mentioned acid with the epoxy compound.

The liquid photo-curable prepolymer (A) of this invention is obtained by the reaction of an epoxy resin containing at least two terminated epoxy groups and an α,β-unsaturated monocarboxylic acid containing at least one vinyl group. In the reaction, the suitable examples of a catalyst which can be used in this invention include triphenylphosphine, triethylamine, methyl triethyl ammonium chloride and so on, preferably triphenyl phosphine. The catalyst may be used preferably in the amount of 0.1 to 10 parts by weight. In order to prevent polymerization, add thermal polymerization inhibitors such as hydroquinone, hydroquinone monomethyl ether preferably. The thermal polymerization inhibitor may be added preferably in the amount of 0.01 to 1 part by weight, per 100 parts by weight of the reaction mixture. The suitable reaction temperature and reaction time may be controlled between 80 and 120° C., 6 and 24 hours, separately. In addition, in the above mentioned reaction product reacting with a saturated or unsaturated polybasic acid anhydride, the suitable reaction temperature and reaction time may be controlled between 80 and 130° C., 4 and 16 hours, separately.

The acid value of the photo-curable prepolymer (A) so obtained suitably falls in the range of 20 to 120 mg KOH/g, preferably 30 to 80 mg KOH/g.

The photo-polymerizable prepolymer (A) in the invention can be used in an amount of 10 to 80 parts by weight, preferably 30 to 50 parts by weight of liquid photosensitive resistive ink composition.

The photo-curable monomer (B) containing at least three vinyl groups and an α,β-unsaturated carboxylic acid is prepared by reacting dipentaerythritol pentaacrylate or pentaerythritol triacrylate with polybasic acid anhydride. Typical representative acid anhydride, which can be used in this invention, includes succinic anhydride, hexahydrophthalic anhydride, methylhexahydrophthalic anhydride, tetrahydrophthalic anhydride and maleic anhydride. Preferably is the product of pentaerythritol triacrylate reacting with tetrahydrophthalic anhydride.

The aforementioned unsaturated monocarboxylic acid (B) cannot be available from commercial market. It can be synthesized by reacting dipentaerythritol penta-acrylate or pentaerythritol triacrylate with polybasic acid anhydride. The proportion of the polybasic acid anhydride taking part in the reactions is 0.5 to 1.1 equivalents, preferably 0.7 to 0.9 equivalent, to 1 equivalent of hydroxyl groups of pentaerythritol acrylate. The suitable examples of a catalyst, which can be used in this invention, include triphenylphosphine, triethyl amine, methyl triethyl ammonium chloride and so on, preferably triphenylphosphine (TPP). The catalyst may be used preferably in an amount of 0.1 to 10 parts by weight of liquid photo-polymerizable resinous composition. In order to prevent polymerization, add thermal polymerization inhibitor such as hydroquinone, hydroquinone monomethyl ether preferably. The thermal polymerization inhibitor may be added preferably in the amount of 0.01 to 1 part by weight of the reaction mixture. The suitable reaction temperature and reaction time may be controlled between 80 to 120° C., 20 to 48 hours, separately. The reaction product is represented by the formula II, as follow:

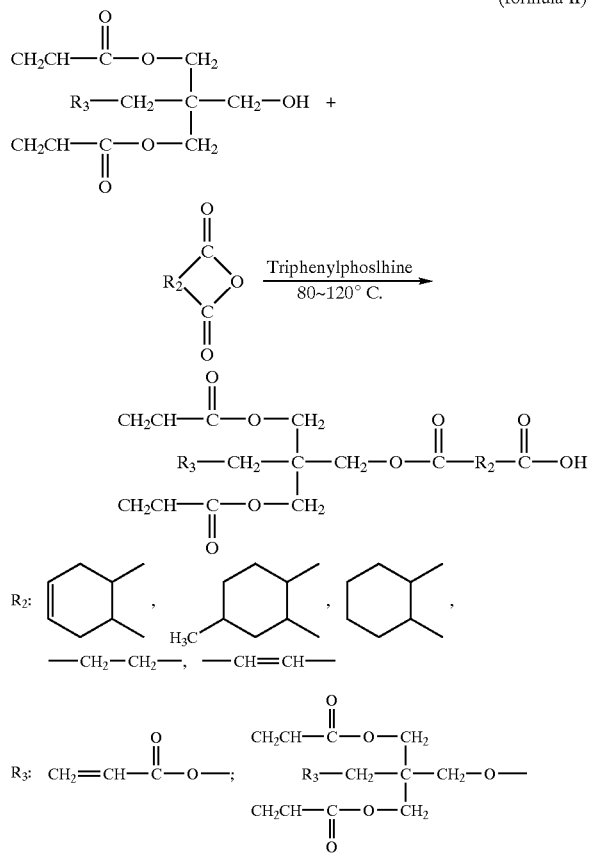

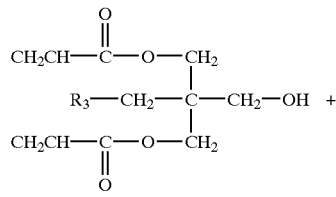

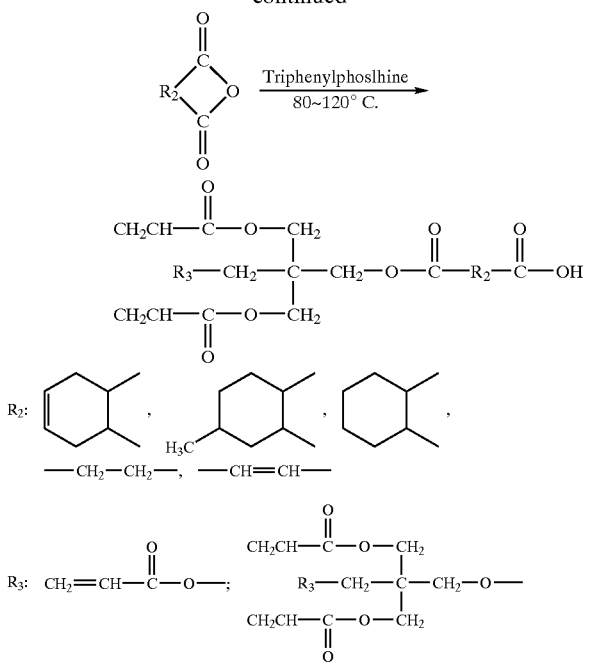

The above mentioned unsaturated monocarboxylic acid (B) in the invention can be used in an amount of 1 to 40 parts by weight, preferably 5 to 20 parts by weight of liquid photosensitive resistive ink composition.

Photo-polymerizable initiator includes any known photo-polymerizable initiator, such as: benzoin methyl ether, benzoin isopropyl ether, 2,2-dimethoxy-2-phenyl-acetophenone, 1,1-dichloro-acetophenone, 1-hydroxycyclohexyl phenyl ketone, 2-methyl-1-[4-(methylthio)phenyl]-2-morpho-lino-propane-1-one, N,N-dimethyl amino-acetoohenine. 2,4-dimethylthioxanthone, 2,4-diethvthioxanthone 2-chloro-thioxanthone, 2,4-diisopropylthioxanthone, acetophenone dimethyl ketal, benzyl dimethyl ketal, methyl benzophenone, 4,4'-dichloro-benzophenone, 4,4'-bis-diethyl-aminobenzophenone, Michler's ketone and the like. These compounds may be used alone or as a mixture of two or more to dissolve the above-mentioned composition. It is most preferred to employ the combination of 2-methyl-1-[4-(methylthio)phenyl]-2-morpho-lino-propane-1-one, (Irgacure 907, manufactured by Ciba-Giegy Co. Ltd.), and 2,4-diisopropylthioxanthone (Kayacure ITX, manufactured by Nippon Kayaku Co. Ltd.)

The photo-polymerizable initiator (c) can be used in an amount of 0.5 to 10 parts by weight, preferably 1 to 5 parts by weight of liquid photo-polymerizable resinous composition.

As for the organic solvent (D) used as diluent in this invention, the suitable examples of organic solvents include propylene carbonate, butyl cellosolve, butyl cellosolve acetate, toluene, xylene, butyl carbitol acetate, cyclohexanone, propylene glycol monomethyl ether, dipropylene glycol diethyl ether, methyl carbitol acetate and so on. Preferable examples can be propylene carbonate and butyl cellosolve acetate.

The organic solvent (D) in this invention can be used in an amount of 15 to 60 parts by weight, preferably 25 to 50 parts by weight of liquid photo-polymerizable resinous composition.

The another characteristic of the invention is the epoxy compound (E) containing at least one vinyl group and an epoxy group in the molecular unit. The epoxy compound which can be dissolved in the organic solvents is a transparent liquid at room temperature and has increased the photosensitivity due to ethylenic reactions possible. Due to small molecular weight, it is easy to be developed with a dilute alkaline aqueous solution. In addition, it is difficult to react with a curing agent or a photo-curable pre-polymer owing to steric hindrance caused by its structure. The compound (E) containing a vinyl group can be also reacted completely with the photo-curable prepolymer during the thermo-curing to cause a good heat resistance and excellent transparency.

The desirable examples of the epoxy compound satisfying all these requirements can be included as bis-phenol S type resins, heterocyclic epoxy resins, bixylenol type epoxy resins, bis-phenol type epoxy resins and tetraglycidyl xylenoyl ethane resins. Among these epoxy resins mentioned above, bixylenol type epoxy resins are particularly desirable.

An α,β-unsaturated monocarboxylic-acid containing at least one vinyl group can be included as acrylic acid, methacrylic acid, crotonic acid and cinnamic acid. Among these unsaturated monocarboxylic acid mentioned above, acrylic acid proves particularly suitable. The proportion of the monocarboxylic acid taking part in the reactions is 0.05 to 1.1 equivalents, preferably 0.1 to 0.5 equivalent, to 1 equivalent of the epoxy group of the epoxy resins. The suitable examples of catalyst in this invention include triphenylphosphine, triethylamine, methyl triethyl ammonium chloride and so on, preferably triphenylphosphine. The catalyst may be used preferably in an amount of 0.1 to 10 parts by weight, per 100 parts by weight of liquid photopolymerizable resinous composition. In order to prevent radicals caused by double bond in polymerization, add thermal polymerization inhibitors such as hydroquinone, hydroquinone monomethyl ether preferably. The thermal polymerization inhibitor may be added preferably in the amount of 0.01 to 1 part by weight, per 100 parts by weight of the reaction mixture. The suitable reaction temperature and reaction time may be controlled between 80 and 120° C., 6 and 12 hours, separately. The reaction product is represented by the general formula III, as follow:

(formula III)

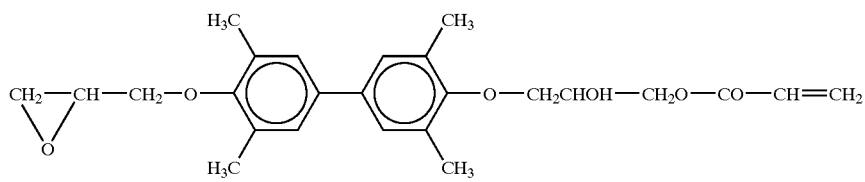

The aforementioned epoxy compound (E) containing at least one vinyl group and one epoxy group in the molecular unit in this invention can be used in an amount of 1 to 60 parts by weight, preferably 5 to 20 parts by weight, per 100 parts by weight of liquid photopolymerizable resinous composition.

As for a curing agent (F) capable of allowing a prepolymer (A) undergo a thermal reaction, it can include any known epoxy compound containing at least two epoxy groups. The suitable examples are triglycidyl isocyanate, phenol novolac epoxy resins, cresol novolac epoxy resins, halogenated phenol novolac epoxy resins, bis-phenol A epoxy resins, bis-phenol F epoxy resins, bis-phenol S epoxy resins, triphenolmethyl epoxy resin, tetrabromo bis-phenol A epoxy resins and so on.

The above mentioned curing agent (F) capable of allowing a prepolymer (A) undergo a thermal reaction can be used in an amount of 0.1 to 15 parts by weight, preferably 0.5 to 5 parts by weight, per 100 parts by weight of liquid photosensitive resistive ink composition.

The major filler used in this invention includes a well-known inorganic filler such as barium sulfate, talc, magnesium carbonate, calcium carbonate, aluminum oxide or silicon dioxide. The filler in this invention can be used in amount of 20 to 40 parts by weight, preferably 25 to 35 parts by weight, per 100 parts by weight of the liquid photopolymerizable resinous composition. In addition, the clay nano-composite (G) intercalated by the quaternary ammonium salt can be added or reacted with an epoxy resin and a curing agent to obtain clay of nano-meter ($10^{-9}$ m) level. The quaternary ammonium salt is represented by $CH_3(CH_3)_nNR_3+$ and the suitable number of n is 3 to 17, preferably 11 to 17 and R represents hydrogen or methyl.

The suitable epoxy resins include phenol novolac type epoxy resins, cresol novolac epoxy resins, halogenated phenol novolac epoxy resins, bis-phenol A epoxy resins, bis-phenol F epoxy resins, bis-phenol S epoxy resins, triphenolmethyl epoxy resins, tetrabromo bis-phenol A epoxy resins and so on. Among these epoxy resins, bis-phenol A epoxy resins and bis-phenol F epoxy resins are particularly preferable. The curing agent can be used in this invention includes primary, secondary and tertiary amine, polythiokol, polyacid, acid anhydride and so on. Particularly preferable is primary amine. Because the clay nano-composite (G) can be dispersed in the composition with a nano-meter particle after curing, an amount of inorganic filler not only can be decreased, but also good heat resistance, scrape resistance, moisture resistance, impact strenght of this composition can be obtained while the clay nano-composite (G) used in this way has no influence on the transparency and gloss of the composition. The clay nano-composite in this invention can be used in an amount of 0.001 to 12.5 parts by weight, preferably 0.05 to 2% by weight of the liquid photosensitive resistive ink composition.

In addition, well known and widely used additives such as coloring pigment represented by phthalocyanine blue, phthalocyanine green, iodine green, diazo yellow, crystal violet, titanium dioxide, carbon black and naphthalene black, thermo-polymerization inhibitors represented by hydroquinone and hydroquinone mono-methyl ether, antifoaming agents represented by silicone type and fluorine type, and leveling agents, and thickening agents represented by clay and fumed silica. Moreover, add melamine in a suitable amount of 0 to 3% by weight of the liquid photopolymerizable resinous composition to increase the cross-linking density of the composition.

Preferred Embodiments

Now the invention, a photosensitive resistive ink composition comprising (A) a photo-curable prepolymer, (B) a photo-curable monomer containing at least three vinyl groups and an α,β-unsaturated carboxylic acid, and (E) an expoxy compound containing at least vinyl group and an epoxy group, will be described more specifically below with reference to preparation examples. It should be noted, however, that the present invention is not limited by these examples. Whenever "parts" and "%" are mentioned, these are invariably used on weights unless otherwise specified.

PREPARATION EXAMPLE OF A PHOTO-CURABLE PREPOLYMER (A)

PREPARATION EXAMPLE 1

210 parts (1 equivalent) of a cresol novolac epoxy resin (softening point :92° C., epoxy equivalent 210) (product of Tohto Kasei Co., Ltd. Japan. Under registered trademark designation of "EPO Tohto" YDCN-704), 72 parts (1 mole) of acrylic acid, 0.72 part of hydroquinone, 90 parts of propylene carbonate and 90 parts of carbitol acetate were fed into a reaction vessel, heated and stirred at 80° C. to dissolve the reaction mixture. 1.05 parts of triphenylphosphine was added till the reaction mixture was completely dissolved. The resulting mixture was heated to a temperature at 110° C. and stirred to react for 24 hours to obtain an esterification product having an acid value of 3 mg KOH/g. Then 52 parts of tetrahydrophthalic anhydride was added, continuously reacted 5 hours at 110° C., a reaction product(A-1) having solid content of 65% and acid value 57 mg KOH/g (on the solid content basis) was obtained.

PREPARATION EXAMPLE 2~3

Follow the same procedure as preparation example 1, excepting the carbitol acetate instead of the propylene carbonate and changing the partial reactants, unsaturated prepolymer can be synthesized by monomer shown in Table 1 having a solid content 65%

TABLE 1

| Preparation Example | 2 | 3 |
|---|---|---|
| Product No. | A-2 | A-3 |
| Acrylic Acid | — | 72 |
| Dimethylolpropionic Acid | 13.4 | — |
| Tetrahydrophthalic anhydride | 35.25 | 74.8 |
| Carbitol anhydride | 85.12 | 103.08 |
| Acid value of the prepolymer (mg KOH/g) | 40 | 77 |

Preparation Example of a Photo-Curable Monomer Containing at Least Three Vinyl Groups and an α,β-Unsaturated Carboxylic Acid (B).

PREPARATION EXAMPLE 4

524 parts (1 equivalent) of dipentaerythritol pentaacrylate and 152 parts (1 mole) of tetrahydrophthalic anhydride, 0.6 part of hydroquinone, 2.6 parts of triphenylphosphine were heated and stirred at 80° C. for an hour in a reactor. Then the hot molten mixture was heated to a temperature at 105° C. and stirred to react for 32 hours to obtain a product having an acid value of 83 mg KOH/g (B-1).

PREPARATION EXAMPLE 5

Follow the same procedure as the preparation example 4, excepting 292 parts of pentaerythritol triacrylate instead of the dipentaerythritol pentaacrylate to obtain a product having an acid value of 126 mg KOH/g (B-2).

Preparation Example of an Epoxy Compound Containing at Least a Vinyl Group and an Epoxy Group.

PREPARATION EXAMPLE 6

184 parts (1 equivalent) of a bixylenol epoxy resin (product of Yuka-Shell Co., Ltd. Japen, under registered trademark designation of YX-4000), 0.1 parts of hydroquinone, 36.38 parts of carbitol acetate were headed and stirred to dissolve the reaction mixture at 90° C. Then a mixture of 0.48 part of triphenylphosphine, and 21.6 parts (0.3 mole) of acrylic acid was added to the molten resin by stepwise for an hour. The resulting mixture was heated to a temperature at 105° C. and stirred to react for 4.5 hours to obtain a product having an acid value of 1 mg KOH/g (E-I).

WORKING EXAMPLE AND COMPARATIVE EXAMPLE

The present invention will be described more specifically below in comparison with working examples and comparative experiments. However, the invention is not limited by these examples. The components shown in the following Table 2 were mixed and kneaded three times with a three-gold plating resistance also decreases because the carboxylic acid group of the prepolymer having a high acid value doesn't react completely with the epoxy resins. In this invention, adding a dissolved epoxy compound (E) which can be dispersed in the ink composition can be added and photo-curability can be increased the opportunity of reacting with prepolymer during post-curing. A steric hindrance due to the epoxy compound (E) can reduce to react with a prepolymer during pre-curing to increase resistance to heat and to have a excellent development. Moreover, adding clay nano-composite (G) dispersed with nano-meter particle in the composition of this invention can increase the surface area of inorganic materials of the photosensitive resistive ink composition to enhance resistance to heat and resistance to electroless gold plating.

TABLE 2

The formulation in the composition of examples

| | | Example | | | | | | Comparative | | |
|---|---|---|---|---|---|---|---|---|---|---|
| | | 1 | 2 | 3 | 4 | 5 | 6 | 1 | 2 | 3 |
| Photo-curable Prepolymer (A) | A-1(acid value:57 mg KOH/g) | 48 | | | 48 | | | 48 | | |
| | A-2(acid value:40 mg KOH/g) | | 48 | | | 48 | | | 48 | |
| | A-3(acid value:77 mg KOH/g) | | | 48 | | | 48 | | | 48 |
| Photo-curable monomer (B) | B-1 | 11.25 | | 11.75 | 10.05 | | 11.55 | 7 | | 7 |
| | B-2 | | 10.75 | | | 10.55 | | | 7 | |
| Photo-initiator (C) | Iragacure 907 | 5 | 5 | 5 | 5 | 5 | 5 | 5 | 5 | 5 |
| | Kayacure ITX | 0.25 | 0.25 | 0.25 | 0.25 | 0.25 | 0.25 | 0.25 | 0.25 | 0.25 |
| Organic solvent (D) | Petroleum solvent | 6.25 | 6.25 | 6.25 | 6.25 | 6.25 | 6.25 | 6.25 | 6.25 | 6.25 |
| | Carbitol acetate | 6.5 | 6.5 | 6.5 | 6.5 | 6.5 | 6.5 | 6.5 | 6.5 | 6.5 |
| Epoxy resin (E) | E-1 | 10 | 6 | 3 | 10 | 6 | 3 | | | |
| Curing Agent (F) | YX-4000 | | | | | | | 8.5 | 8.5 | 8.5 |
| | NPCN-702 | | 3 | 6 | | 3 | 6 | | | |
| Clay Nano-composite (G) | Intercalated by quaternary ammonium salt | 0.25 | 0.25 | 0.25 | | | | | | |
| | After intercalation, reacting with epoxy compound and curing agent | | | | 0.45 | 0.45 | 0.45 | | | |
| Additives | Melamine | 2 | 2 | 2 | 2 | 2 | 2 | 2 | 2 | 2 |
| | Barium sulfate | 10 | 10 | 10 | 10 | 10 | 10 | 10 | 10 | 10 |
| | Silicon oxide power | | | | | | | 5 | 5 | 5 |
| | Phthalocyanine Green | 0.5 | 0.5 | 0.5 | 0.5 | 0.5 | 0.5 | 0.5 | 0.5 | 0.5 |
| | KS-66(Ant-foaming agent) | 1 | 1 | 1 | 1 | 1 | 1 | 1 | 1 | 1 |
| | Total | 100 | 100 | 100 | 100 | 100 | 100 | 100 | 100 | 100 | roll mill to produce a photosensitive resistive ink composition. This photosensitive resistive ink composition was applied to a copper via-hole printed circuit board in a film thickness of 20 to 30 $\mu$m by a screen printing method or applied to a copper clad laminate in a film thickness of 1 to 3 $\mu$m by a rubbery scraper printing method, followed by drying in a hot air recycle type dryer at 80° C. for 60 minutes. The coating thus obtained is then irradiated with ultraviolet rays having an intensity of 25 mW/cm$^2$ at a wavelength of 365 nm. Then it was developed with 1% sodium carbonate aqueous solution and by spraying under a pressure of 2 kg/cm$^2$ for 60 seconds and cured by heat using the hot air recycle type dryer at a temperature in the range of 100 to 200° C. for half to one hour, to form a solder resist pattern.

In the comparative examples, because the undissolved refined epoxy resin was restricted to its network structure after photo-curing, it is difficult to react with a prepolymer to cause poor resistance to heat. In addition, the electroless Irgacure 907: Photo-initiator, manufactured by Ciba Geigy Co. Ltd. 2-methyl-1 [4-(methylthio)phenyl]-2-morpholino-1-propane.

Kayacure ITX: Photo-initiator, manufactured by Nippon kayaku Co. Ltd. Japan, isoproyl-9-oxo-thioxanthone.

YX4000: bixylenol type epoxy resin, manufactured by Yuka Shell Co. Ltd. Japan.

NPCN 702: the epoxy resin, manufactured by Nan Ya Plastics Co. Ltd. Taiwan.

Experiment

In the aforementioned working examples 1 to 6 and comparative examples 1 to 3, thin-film examples only take developability test, thick-film examples before development take a tackiness test, examples before thermo-curing take developability test and photosensitivity test. Examples after thermo-curing take adhesion test, solder heat resistance test, plating resistance test, acid and base resistance test, solvent resistance test and pencil hardness test.

1. Tackiness after Drying

The tackiness of the pre-cured coating film was measured by finger touch and evaluated using the following criteria:

⊚: No tackiness at all.

Δ: A little tackiness was felt, but there was no trace of a finger print.

X: A trace of a finger print were left on the coating film.

2. Developability

The developing property was determined by pre-curing for a various duration of 70, 80, 90 minutes thereby producing a test piece, developing the test piece for 60 seconds with a relevant developing solution applied by spraying under a pressure of 2 kg/cm², and visually rating the condition of removal of the unexposed part of the coating on the following criteria.

⊚: Perfect development.

○: Minor undeveloped surface portion was observed.

Δ: Minor undeveloped portion throughout the entire surface was observed.

X: Substantial absence of development.

3. Adhesion

One hundred cross-cuts (10×10) were made on the coated film and the peeling test (according to JIS D0202) was performed using a cellophane tape (peeling after sticking the cellophane tape onto the coated film). The peeling of the crosscut is evaluated by the criteria.

⊚: Total absence of peeling. (100/100)

○: Slight peeling in cross-cut portions. (100/100)

Δ: 50 to 90 parts in 100 parts crosscut were found unpeeled. (50/100 to 90/100)

X: 0 to 50 parts in 100 parts crosscut were found unpeeled. (0/100 to 50/100)

4. Solder Heat Resistance

The peeling test (according to JIS C6481) was performed using cellophane tape after dipping the sample in a solder bath at 260° C. for 10 seconds and the solder heat resistance was evaluated by the following criteria.

○: No abnormality in the coated film

Δ: Slight bulging or blistering, color change on the coated film.

X: Bulging or blistering on the coated film.

5. Electroless Plating Resistance

First, the test piece is immersed in the acid degrease liquid for 3 minutes at 30° C. to be degreased. Then, immersed in water for 3 minutes to be cleaned. Second, the test piece will be immersed in the water containing 14.3 weight % $(NH_4)_2SO_4$ for 3 minutes to perform soft etching. Then cleaning in water for 3 minutes. At room temperature, immersing in the water containing 10 vol. % $H_2SO_4$, for 1 minute, then in water for 30 seconds to 1 minute to clean the test piece. After that, at 30° C., immersing in activation liquid for 7 minutes then test piece to be activated. Follow this, immersing in water for 3 minutes to clean the activated test piece then subjecting to the nickel plating by immersing in nickel plating bath for 20 minutes at 85° C. At room temperature, for immersing in 10 vol. % sulfuric acid solution for 1 minute, rinsing the test piece by running water for 3 minutes, then subjecting to the gold plating by immersing in gold plating bath 10 minutes at 95° C. Next, clean it by immersing on running water for 3 minutes, and in hot water for 3 minutes at 60° C. to clean completely. After fully drying, the gold plated test piece is obtained. Then perform the peeling test with cellophane tape on the test piece to evaluate the peeling condition of protective mask.

○: No abnormality in the coated film

Δ: Slight bulging or blistering on the coated film

X: Bulging or blistering on the coated film

6. Evaluation of Sensitivity

A step wedge having a difference of 0.15 (expressed in terms of Δlog E) in density level was brought into contact with each dry film, exposed under illuminance of 1,000 mj/cm² by means of a 5 KW ultra high pressure mercury lamp, and then developed for twice as long as the time at which the unexposed dry film was dissolved to obtain a negative image corresponding to the wedge. Thus, the step number at which the corresponding part of the dry film was thoroughly eluted (clear step number) was examined. A higher step number corresponds to a higher sensitivity.

7. Evaluation of Pencil Hardness

The pencil hardness was determined by measuring hardness of the same test piece as used in the test for adhesion in accordance with the method specified in JIS K 5400 6-14 under a fixed load of 1 kg. This property was reported by the highest hardness, which inflicted no dent on the coating. The pencils of hardness 2B~9H used for this test were "Mitsubishi Hi-Uni" (made by Mitsubishi Pencil Co., Ltd. Japan).

8. Evaluation of Acid Resistance

Exposure, development and after-curing processing were carried out in the same manner as in the evaluation of adhesion, and each sample was soaked for 30 minutes at 20° C. in a 10 vol. % aqueous solution of sulfuric acid. Then, the condition and the adhesiveness of the resulting film were judged collectively.

⊚: Total absence of change.

○: Very slight perceivable change.

Δ: Peeling on not more than 10% of coated surface.

X: Peeline on entire coated surface.

9. Evaluation of Base Resistance

Exposure, development and after-curing processing were carried out in the same manner as in the evaluation of adhesion, and each sample was soaked for 30 minutes at 20° C. in a 10 weight % aqueous solution of sodium hydroxide. Then, the condition and the adhesiveness of the resulting film were judged collectively.

⊚: Total absence of change.

○: Very slight perceivable change.

Δ: Peeling on not more than 10% of coated surface.

X: Peeling on entire coated surface.

10. Solvent Resistance

Exposure, development and after-curing processing were carried out in the same manner as in the evaluation of adhesion, and each sample was soaked for 30 minutes at 20° C., in trichloromethane and acetone. Then, the condition and the adhesiveness of the resulting film were judged collectively.

⊚: Total absence of change.

○: Very slight perceivable change.

Δ: Peeling on not more than 10% of coated surface.

X: Peeling on entire coated surface.

11. Resolution

Exposure, development and after-curing processing were carried out in the same manner as in the evaluation of adhesion. The resulting resist pattern was observed by means of a micro-scope (×100) to judge a line width of the mask pattern formed separately by each resist. The smaller the resolution value, the higher the resolution power of the photo-resist, therefore the photo-mask can be widely applied.

TABLE 3

Coating properties comparison of working and comparative examples

|  |  | Example | | | | | | Comparative | | |
|---|---|---|---|---|---|---|---|---|---|---|
|  |  | 1 | 2 | 3 | 4 | 5 | 6 | 1 | 2 | 3 |
| Tackiness after drying (1) | | ○ | ○ | ○ | ○ | ○ | ○ | ○ | ○ | ○ |
| Developability (2) | | | | | | | | | | |
| 70 Min | Thick film (25 μm) | ◎ | ◎ | ◎ | ◎ | ◎ | ◎ | ◎ | ◎ | ◎ |
|  | Thin film (5 μm) | ◎ | ◎ | ◎ | ◎ | ◎ | ◎ | ◎ | ◎ | ◎ |
| 80 Min | Thick film (25 μm) | ◎ | ◎ | ◎ | ◎ | ◎ | ◎ | ◎ | ◎ | ◎ |
|  | Thin film (5 μm) | ◎ | ◎ | ◎ | ◎ | ◎ | ◎ | ◎ | ○ | △ |
| 90 Min | Thick film (25 μm) | ◎ | ◎ | ◎ | ◎ | ◎ | ◎ | ○ | × | × |
|  | Thin film (5 μm) | ◎ | ◎ | ○ | ◎ | ◎ | ○ | × | × | × |
| Adhesion (3) | | ◎ | ◎ | ◎ | ◎ | ◎ | ◎ | ◎ | ◎ | ◎ |
| Solder heat resistance (4) | | ○ | ○ | ○ | ◎ | ◎ | ◎ | △ | △ | △ |
| Electroless plating resistance (5) | | ◎ | ◎ | ◎ | ◎ | ◎ | ◎ | ○ | ○ | ○ |
| Sensitivity (6) | | 13 | 12 | 13 | 13 | 12 | 13 | 14 | 13 | 13 |
| Pencil hardness (7) | | 6H | 6H | 6H | 6H | 6H | 6H | 6H | 6H | 6H |
| Acid resistance (8) | | ◎ | ◎ | ◎ | ◎ | ◎ | ◎ | ◎ | ◎ | ◎ |
| Base resistance (9) | | ◎ | ◎ | ◎ | ◎ | ◎ | ◎ | ○ | ◎ | ○ |
| Resistance to solvent (10) | | ◎ | ◎ | ◎ | ◎ | ◎ | ◎ | ◎ | ◎ | ◎ |
| Resolution (11) | | 50 μm | 50 μm | 60 μm | 50 μm | 50 μm | 50 μm | 50 μm | 50 μm | 50 μm |

From the aforementioned result, a photo-curable prepolymer (A), a photo-curable monomer (B) containing at least three vinyl groups and a carboxylic acid, an epoxy compound (E), and a clay nano-composite (G) in the invention play very important roles. The composition of this invention can be developed by a dilute alkali aqueous solution due to the carboxylic group in the photo-curable monomer make a large differences in compatibility of a dilute alkali aqueous solution between exposed and unexposed area. And it may decrease the possibility of reacting with a curing agent owing to an epoxy compound providing a steric hindrance. In addition, a photo-curable prepolymer having a low acid value, a photo-curable epoxy compound and a clay nano-composite in this invention can provide a film excellent in sensitivity, solder heat resistance and electroless gold plating resistance.

What is claimed is:

1. A photosensitive resistive ink composition, which comprises (A) a photocurable prepolymer represented by the formula I in an amount of 10 to 80% weight of the photosensitive resistive ink composition which is prepared by reacting (a) epoxy compound containing at least two terminated epoxy groups with (b) an α,β-unsaturated monocarboxylic acid containing at least one vinyl group and then reacting with (c) a saturated or unsaturated polybasic acid anhydride, (B) a photo-curable monomer containing at least three vinyl groups and an α,β-unsaturated carboxylic acid represented by the formula II in an amount of 1 to 40% weight of the photosensitive resistive ink composition, (C) a photo-initiator in an amount of 0.5 to 10% weight of the photosensitive resistive ink composition, (D) organic solvents in an amount of 15 to 60% weight of the photosensitive resistive ink composition, (E) an epoxy compound containing at least one vinyl group and one epoxy group in the molecule unit represented by the general formula III in an amount of 1 to 60% weight of the photosensitive resistive ink composition, (F) a curing agent capable of allowing a photocurable prepolymer (A) undergo a thermal reaction in an amount of 0.1 to 15% weight of the photosensitive resistive ink composition, and (G) a clay nano-composite in an amount of 0.001 to 2% weight of the photosensitive resistive ink composition;

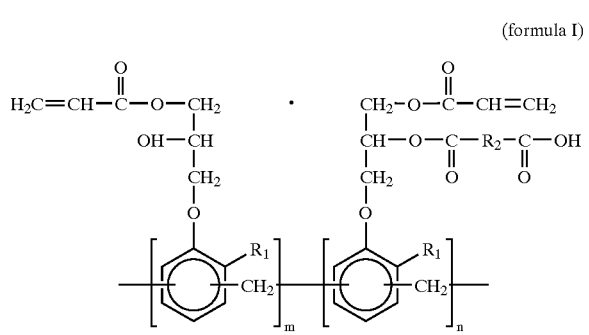

m,n: repeating unit, represented by integrals as $2 < m+n \leq 20$;

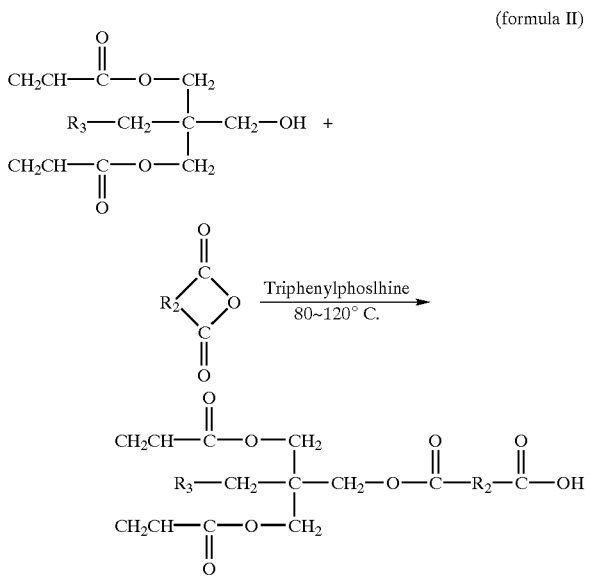

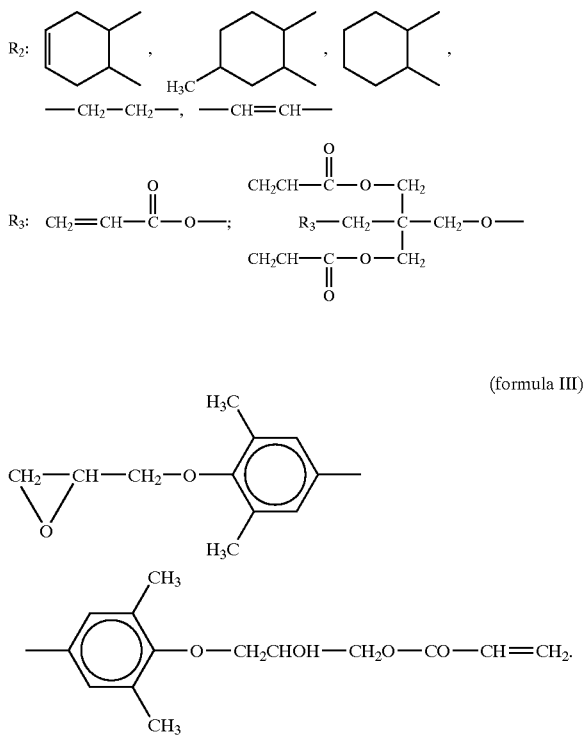

2. A photosensitive resistive ink composition as claimed in claim 1, wherein the photocurable prepolymer (A) (formula I), $R_1$ represents hydrogen or methyl, $R_2$ represents cyclohexenyl, methyl cyclohexyl, cyclohexyl, ethyl and vinyl.

3. A photosensitive resistive ink composition as claimed in claim 1, wherein the photocurable pre-polymer (A) can be prepared by reacting (a) epoxy compounds containing at least two terminated epoxy groups with (b) an α,β-unsaturated monocarboxylic acid containing at least one vinyl group and then reacting with (c) a saturated or unsaturated polybasic acid anhydride; the proportion of the unsaturated carboxylic acid is 0.5 to 1.2 equivalent of epoxy group and the proportion of the polybasic acid anhydride is 0.1 to 1.0 equivalent of hydroxyl group of the product prepared by reacting compound (a) with compound (b).

4. A photosensitive resistive ink composition as claimed in claim 1, wherein the photocurable prepolymer (A) can be a reaction product by reacting (a) an epoxy resin containing at least two terminated epoxy groups selected from one or more than one of the group of phenol novolac epoxy resins, cresol novolac epoxy resins, halogenated phenol novolac epoxy resins and the α,β-unsaturated monocarboxylic acid (b) can be selected from succinic anhydride, hexahydrophthalic anhydride, methylhexahydrophthalic anhydride, tetrahydrophthalic anhydride and maleic anhydride.

5. A photosensitive resistive ink composition as claimed in claim 1, wherein the acid value of the photocurable prepolymer (A) is in the range of 20–120 mg KOH/g.

6. A photosensitive resistive ink composition as claimed in claim 1 wherein the photocurable monomer (B) containing at least containing at least three vinyl groups with an α,β-unsaturated carboxylic acid can be prepared by reacting dipentaerythritol pentaacrylate or pentaerythritol triacrylate with polybasic acid anhydride; said polybasic acid anhydride can be selected from the group of succinic anhydride, hexahydrophthalic anhydride, methylhydrophthalic anhydride, tetrahydrophthalic anhydride and maleic anhydride.

7. A photosensitive resistive ink composition as claimed in claim 1 wherein the photocurable monomer (B) containing at least three vinyl groups with an α,β-unsaturated carboxylic acid can be prepared by reacting dipentaerythritol pentaacrylate orpentaerythritol triacrylate with polybasic acid anhydride and the proportion of the polybasic anhydride taking part in the reactions is 0.8 to 1.1 equivalents to 1 equivalent of hydroxyl group of the unsaturated monocarboxylic acid.

8. A photosensitive resistive ink composition as claimed in claim 1, wherein the epoxy compound (E) containing at least one vinyl group and one epoxy group in the molecule unit can be prepared by reacting the epoxy compound with an unsaturated monocarboxylic acid and the proportion of monocarboxylic acid taking part in the reactions is 0.05 to 1.1 equivalents to 1 equivalent of epoxy group of the epoxy compound.

9. A photosensitive resistive ink composition as claimed in claim 8, wherein the epoxy compound (E) can be selected from one of the group of bis-phenol S epoxy resins, heterocyclic epoxy resins, bixylenol epoxy resins, biphenol epoxy resins and tetraglycidyl xylenoyl ethane resins.

10. A photosensitive resistive ink composition as claimed in claim 1, wherein the clay nano-composite used can be selected from talc, magnesium carbonate, calcium carbonate, aluminum oxide, and silicon dioxide.

11. A photosensitive resistive ink composition as claimed in claim 1, which further comprises at least one additive selected from the group consisting of coloring agents, polymerization inhibitors, anti-foaming agent, leveling agent and adhesion promoters.

* * * * *